(12) United States Patent
Shieh et al.

(10) Patent No.: US 7,391,061 B2
(45) Date of Patent: Jun. 24, 2008

(54) LIGHT EMITTING DIODE WITH THERMAL SPREADING LAYER

(75) Inventors: Yuh-Ren Shieh, Hsinchu (TW); Jen-Chau Wu, Hsinchu County (TW); Chuan-Cheng Tu, Taipei County (TW)

(73) Assignee: Epistar Corporation, Hsinchu (TW)

( * ) Notice: Subject to any disclaimer, the term of this patent is extended or adjusted under 35 U.S.C. 154(b) by 19 days.

(21) Appl. No.: 11/316,461

(22) Filed: Dec. 22, 2005

(65) Prior Publication Data
US 2006/0289875 A1    Dec. 28, 2006

(30) Foreign Application Priority Data
Jun. 22, 2005    (TW) .............................. 94120796 A

(51) Int. Cl.
*H01L 23/373* (2006.01)
(52) U.S. Cl. ................... 257/99; 257/707; 257/E23.111
(58) Field of Classification Search ................. 257/314, 257/E33.063, E23.111
See application file for complete search history.

(56) References Cited

U.S. PATENT DOCUMENTS

| | | | |
|---|---|---|---|
| 6,413,589 B1 * | 7/2002 | Li ............................ 427/376.6 |
| 6,420,197 B1 * | 7/2002 | Ishida et al. .................. 438/22 |
| 6,458,612 B1 | 10/2002 | Chen |
| 6,462,358 B1 * | 10/2002 | Lin et al. ....................... 257/99 |
| 6,627,921 B2 * | 9/2003 | Wong et al. .................... 257/79 |
| 6,812,067 B2 * | 11/2004 | Chen et al. .................. 438/122 |
| 7,060,153 B2 * | 6/2006 | Yamazaki et al. ............ 156/249 |
| 2001/0042866 A1 * | 11/2001 | Coman et al. ............... 257/103 |
| 2003/0159817 A1 * | 8/2003 | Azuma ........................ 165/185 |
| 2003/0178637 A1 * | 9/2003 | Chen et al. .................. 257/189 |
| 2004/0009649 A1 * | 1/2004 | Kub et al. .................... 438/459 |
| 2004/0149810 A1 * | 8/2004 | Yang et al. ................... 228/175 |
| 2005/0048739 A1 * | 3/2005 | Kerdiles et al. ............. 438/458 |

FOREIGN PATENT DOCUMENTS

JP          3006872         1/1991

OTHER PUBLICATIONS

Wang et al. "Nucleation and growth of diamond films on aluminum nitride by hot filament chemical vapor deposition" Diamond and Related Materials 9, pp. 1660-1663, Copyright 2000 by Elsevier Science.*

* cited by examiner

*Primary Examiner*—Carl Whitehead, Jr.
*Assistant Examiner*—Jennifer M Dolan
(74) *Attorney, Agent, or Firm*—Snell & Wilmer L.L.P.

(57) ABSTRACT

A light emitting diode and the method of the same are provided. The light emitting diode includes a substrate, a thermal spreading layer, a connecting layer and an epitaxial structure. The substrate is selected from a transparent substrate or a non-transparent substrate, which corresponds to different materials of the connecting layers respectively. The thermal spreading layer, configured to improve the thermal conduction of the light emitting diode, is selected from diamond, impurity-doped diamond or diamond-like materials.

13 Claims, 4 Drawing Sheets

LIGHT EMITTING DIODE WITH THERMAL SPREADING LAYER

CROSS-REFERENCE TO RELATED APPLICATIONS

This application claims priority to Taiwan Patent Application No. 94120796 entitled "Light Emitting Diode And Method Of The Same," filed on Jun. 22, 2005, which is incorporated herein by reference and assigned to the assignee herein.

FIELD OF INVENTION

The present invention generally relates to a light emitting diode and a method making the same, and more particularly, to a light emitting diode and method making the same with a thermal spreading layer.

BACKGROUND OF THE INVENTION

Since the light emitting diodes (LEDs) are widely applied in various application fields, many different structures and manufacturing methods for making the light emitting diodes have been developed. For example, U.S. Pat. No. 6,462,358 issued to Lin et al., entitled "Light emitting diode and method for manufacturing the same" discloses a light emitting diode with a transparent substrate which is connected to an epitaxial structure by an adhesive layer. The light emitting diode of Lin et al. has better luminous efficiency due to the lower absorption of light, lower forward voltage and better current distribution of the transparent substrate. However, the light emitting diode may impose a local thermal concentration and further limit its performance due to the low thermal conductivity of the transparent substrate. U.S. Pat. No. 6,458,612 issued to Chen et al., entitled "Method of fabricating high efficiency light-emitting diode with a transparent substrate" also discloses a light emitting diode with a transparent substrate.

For another example, U.S. Pat. No. 6,812,067, issued to Chen et al., entitled "Method for integrating compound semiconductor with substrate of high thermal conductivity" discloses a compound semiconductor structure with a nontransparent substrate, which employs a metal of low melting point to form two bonding layers on the substrate and the epitaxial structure respectively, and connects the substrate with the epitaxial structure by connecting two bonding layers. However, the light emitting diode in U.S. Pat. No. 6,812,067 adopts the high conductivity material for the nontransparent substrate restricting the structure of the light diode.

Therefore, there is a need to provide a light emitting diode and a method making the same suitable for various structures of the light emitting diode to improve the thermal conductivity of the light emitting diode.

SUMMARY OF THE INVENTION

In viewing the drawbacks of prior art light emitting diodes, the present invention provides a light emitting diode and a method making the same for improving the thermal conductivity of the light emitting diode.

One aspect of the present invention is to provide a light emitting diode with a thermal spreading layer on a transparent substrate.

Another aspect of the present invention is to provide a light emitting diode with a thermal spreading layer on a nontransparent substrate.

Still another aspect of the present invention is to provide a method of fabricating a light emitting diode, which comprises the following steps: providing a first substrate; forming a thermal spreading layer on the first substrate; forming a connecting layer on the thermal spreading layer; providing a second substrate; forming an etching stop layer on the second substrate; forming an epitaxial structure on the etching stop layer; forming an ohmic contact epitaxial layer on the epitaxial structure; forming a first ohmic contact layer on the ohmic contact epitaxial layer; connecting the epitaxial structure with the thermal spreading layer by the connecting layer; removing the etching stop layer and the second substrate; removing a part of the epitaxial structure and parts of the ohmic contact epitaxial layer to expose a part of the ohmic contact epitaxial layer; etching the ohmic contact epitaxial layer to form a hole to expose parts of the first ohmic contact layer; forming a first metal adhesive layer on the exposed part of the ohmic contact epitaxial layer to electrically connect with the first ohmic contact layer through the hole; forming a second ohmic contact layer touching the epitaxial structure; and forming a second metal adhesive layer touching the second ohmic contact layer.

A further aspect of the present invention is to provide a method of fabricating a light emitting diode, which comprises the following steps: providing a first substrate; forming a protective layer on the first substrate; forming a thermal spreading layer on the protective layer; forming a wetting layer on the thermal spreading layer; forming a barrier layer on the wetting layer; forming a first bonding layer on the barrier layer; providing a second substrate; forming an epitaxial structure on the second substrate; forming a second bonding layer on the epitaxial structure; connecting the epitaxial structure with the barrier layer by connecting the first bonding layer with the second bonding layer; and removing the second substrate.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION

The present invention provides a light emitting diode and method making the same. For better understanding, please read the following description in conjunction with the accompanying drawings.

Figure 1:
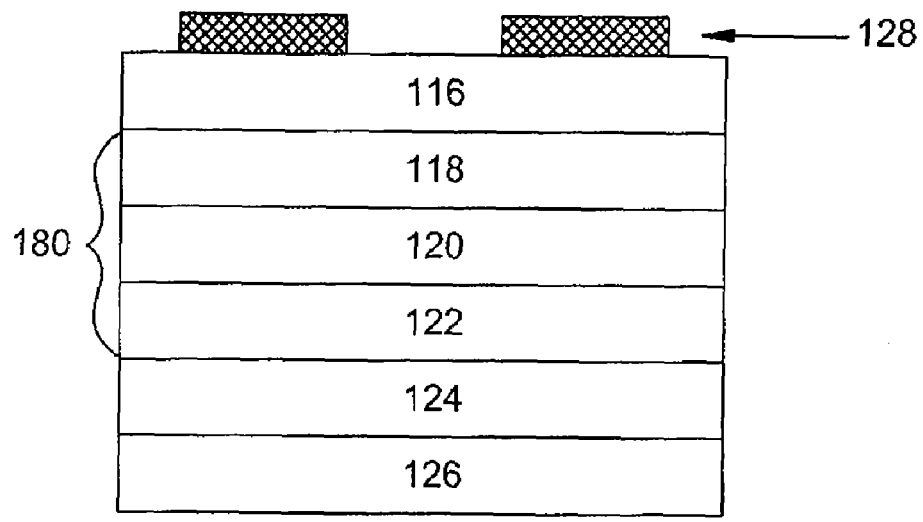
FIGS. 1 to 3 illustrate a cross-section view of a light emitting diode in accordance with an embodiment of the present invention.
Figure 2:
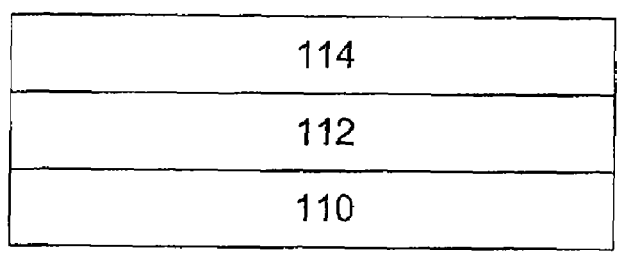
Figure 3:
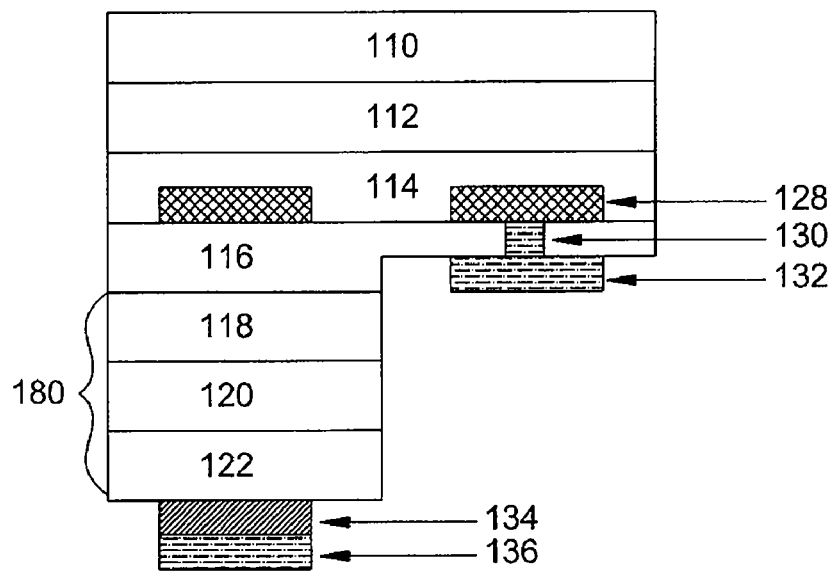

FIGS. 1 to 3 illustrate the cross-section views corresponding to the steps of fabricating a light emitting diode in accordance with an embodiment of the present invention. At first, referring to FIG. 1, an etching stop layer 124 is formed on a substrate 126, and then a lower cladding layer 122, an active layer 120, an upper cladding layer 118 and an ohmic contact epitaxial layer 116 are formed successively. Then, an ohmic contact layer 128 is formed on the ohmic contact epitaxial layer 116. Note that the lower cladding layer 122, the active layer 120, and the upper cladding layer 118 can be named as an epitaxial structure 180.

According to the present invention, the substrate 126 is selected form Si, Ge, GaAs, GaP, InP or the like. The active layer 120 includes a material such as AlGaInP, InGaN or AlGaAs, and has a conventional structure, such as a homostructure, single heterostructure, double heterostructure (DH), or multiple quantum well (MQW).

The ohmic contact epitaxial layer 116 has a material selected from AlGaAs, AlGaInP, GaPAs or other materials having a larger energy gap than the active layer 120 and a high carrier concentration for becoming the ohmic contact layer.

The etching stop layer 124 is selected from a group of III-V compound semiconductor. Any material having lattice matched with that of the substrate 126 and having an etching rate lower than the etching rate of the substrate 126 is suitable for the etching stop layer 124.

The etching stop layer 124 is preferably made of InGaP or AlGaAs. If the etching rate of the lower cladding layer 122 is lower than the etching rate of the substrate 126 and the lower cladding layer 122 is thick enough, the etching stop layer 124 is then an option.

Then, as illustrated in FIG. 2, a thermal spreading layer 112 is formed on a transparent substrate 110, and then a transparent adhesive layer 114 is formed on the thermal spreading layer 112. The material of the thermal spreading layer 112 is selected from a material of high thermal conductivity, such as diamond or diamond-like material, with a thickness of 1~100 micron formed by chemical vapor deposition. Note that the impurity-doped diamond and impurity-doped diamond-like material are also available for the material of the thermal spreading layer 112, wherein the doped impurity is selected from a group consisting of B, N, and P. The transparent adhesive layer 114 is selected from BCB (Benzocyclobutene) formed by spin-coat method. However, the transparent adhesive layer 114 is not limited to the BCB, and other adhesive materials of transparent property, such as epoxy, is suitable for the present invention.

The transparent substrate 110 is selected from materials which do not absorb the light from the active layer 120, such as glass, sapphire, SiC, GaP, GaAsP, ZnSe, ZnS and ZnSSe. The transparent substrate 110 can be selected from polycrystal or amorphous substrate to lower the cost.

Then, after the ohmic contact layer 128 has been formed, the light emitting diode in FIG. 1 is connected to transparent substrate 110 in FIG. 2 by pressuring the BCB adhesive layer 114 at high temperature of around 250° C. for a while. Accordingly, it should be understood that the transparent adhesive layer 114 can be a connecting layer.

The nontransparent substrate 126 is etched away by a corrosive etchant, such as $5H_3PO_4:3H_2O_2:3H_2O$ or $1NH_4OH:35H_2O_2$. If the etching stop layer 124 is made of light-absorption materials, such as InGaP or AlGaAs, the etching stop layer 124 must be removed by the same solution.

Then, referring to FIG. 3, parts of the lower cladding 122, the active layer 120, the upper cladding layer 118 and ohmic contact epitaxial layer 116 are removed by a dry etching process, such as reactive ion etching (RIE), to expose the ohmic contact epitaxial layer 116. Subsequently, the exposed ohmic contact epitaxial layer 116 is etched to form a hole 130 exposing the ohmic contact layer 128. Then, an ohmic contact layer 134 is formed on the lower cladding layer 122, wherein the ohmic contact epitaxial layer 134 is formed of a p-type material. Then, a metal adhesive layer 132 is formed on the ohmic contact epitaxial layer 116 and filled within the hole 130 to electrically connect with the p-type ohmic contact layer 128, and a metal adhesive layer 136 is formed on the ohmic contact layer 134 as well. Consequently, the two metal adhesive layers 132 and 136 are on the same side with respect to the transparent substrate 110, as shown in FIG. 3.

Figure 4:
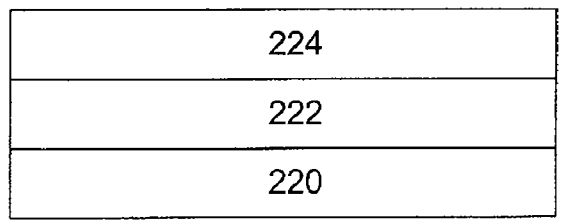
FIGS. 4 to 8 illustrate a cross-section view of a light emitting diode in accordance with another embodiment of the present invention.

FIGS. 4 to 8 illustrate the cross-section views corresponding to another embodiment of the present invention for fabricating a light emitting diode. As shown in FIG. 4, an epitaxial structure 222 is formed on a compound semiconductor substrate 220. The compound semiconductor substrate 220 includes a material such as GaAs, InP, GaP, sapphire or SiC. Then, a first bonding layer 224 is formed on the epitaxial structure 222.

Figure 5:
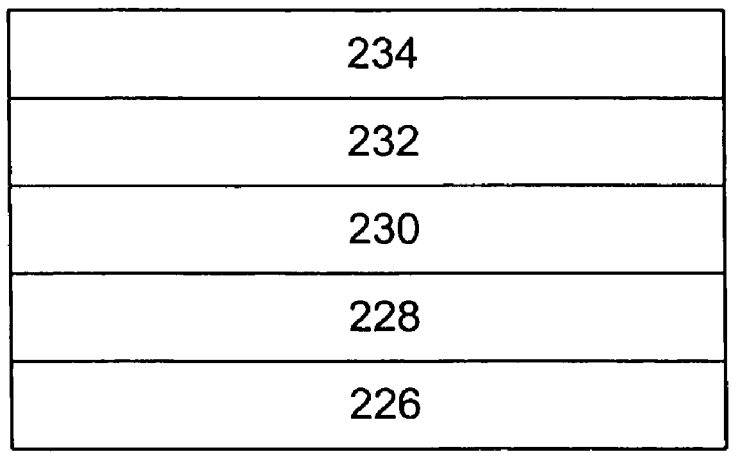

Referring to FIG. 5, a high thermal conductivity substrate 226 is provided, which has a thermal conductivity greater than that of the compound semiconductor substrate 220 and is selected form Si, Al, Cu, Au, Mo, Aluminum nitride, or the like. Then, a thermal spreading layer 228 and a wetting layer 230 are formed sequentially on the high thermal conductivity substrate 226. The thermal spreading layer 228 is configured to improve the thermal conductivity of the light emitting diode, and is made of diamond and diamond-like material. Note that the impurity-doped diamond and impurity-doped diamond-like material are also available for the material of the thermal spreading layer 228, wherein the doped impurity is selected from a group consisting of B, N, and P. The wetting layer 230 is configured to enhance the adhesion between layers, and includes a material such as Chromium, Titanium, Nickel or the like.

Then, a barrier layer 232 is formed on the wetting layer 230. The barrier layer 232 serves the purpose of preventing the internal diffusion of the material of subsequently formed second bonding layer 234 to the wetting layer 230 or the high thermal conductivity substrate 226. The barrier layer 232 includes a material selected from a group consisting of Mo, Pt, W, Indium Oxide, Tin Oxide, Indium Tin Oxide, Zinc Oxide and Magnesium Oxide.

Then, a second bonding layer 234 is formed on the barrier layer 232. One of the first and the second bonding layer, 224 and 234, is a metal layer, such as an Indium layer, having a melting point in the range between about 160° C. and 400° C. The other bonding layer (224 or 234) is a layer of any material, such as Gold, which forms an alloy-bonding layer with the metal layer. In addition, the method of forming the first and the second bonding layers, 224 and 234, includes conventional processes of deposition, evaporation, or sputtering.

Figure 6:
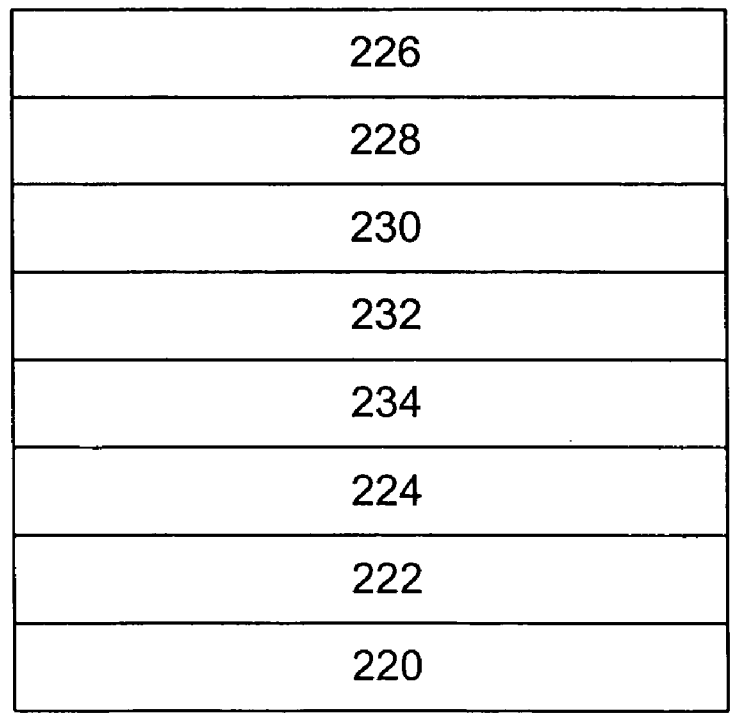
Figure 7:
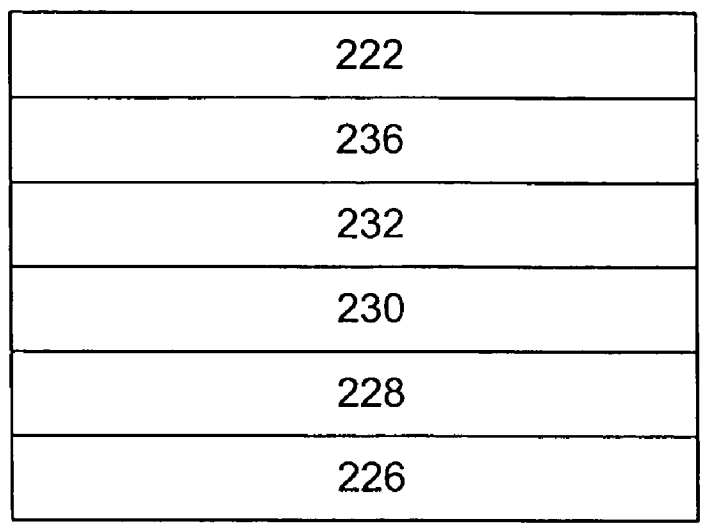

Referring to FIG. 6, the first bonding layer 224 and the second bonding layer 234 are positioned face-to-face and pressed at a temperature to form an alloy layer 236 (as shown in FIG. 7). The process temperature depends on the melting point of selected material of the bonding layers. Accordingly, it should be understood that the alloy layer 236 between the epitaxial structure 222 and the barrier layer 232 can serve as a connecting layer.

Then, the compound semiconductor substrate 220 is removed by a conventional process, such as a wet chemical etching or dry etching process, and then a compound semiconductor is integrated with the high thermal conductivity substrate 226, as shown in FIG. 7.

Figure 8:
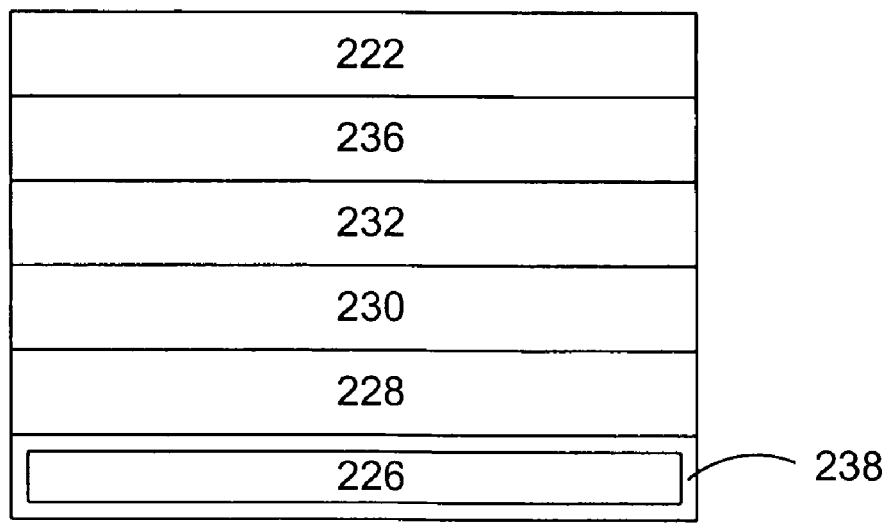

Since the high thermal conductivity substrate 226 is usually highly active to chemical reactants, a protective layer 238 is optionally formed on the substrate 226 to prevent the high thermal conductivity substrate 226 from reacting with chemical reactant. In other words, the method further includes the step of forming a protective layer 238 over the surface of the substrate 226 by conventional electroplate technique prior to the formation of the thermal spreading layer 228. The protective layer 238 includes a material of Ni, Au, Ag, Cr, or the like, and the thickness of the protective layer 238 is relatively small compared with the thickness of the substrate 226. FIG. 8 shows a cross-sectional view of the light emitting diode having the protective layer 238.

The light emitting diodes of the present invention have excellent heat dissipation, and therefore have better performance and can be operated at high current. Besides, the process method of the present invention is simple and suitable for various structures of the light emitting diode.

By means of the detailed descriptions of what is presently considered to be the most practical and preferred embodiments of the subject invention, it is expected that the features and the gist thereof be clearly described. Nevertheless, these embodiments are not intended to be construed in a limiting sense. Instead, it will be well understood that any analogous variations and equivalent arrangements will fall within the spirit and scope of the invention.

We claim:

1. A light emitting diode, comprising:
    a substrate;
    a thermal spreading layer formed on said substrate;
    a connecting layer formed on said thermal spreading layer;
    an ohmic contact layer formed on said connecting layer;
    an ohmic contact epitaxial layer formed on the connecting layer;
    an epitaxial structure formed on a portion of said ohmic contact epitaxy layer;
    a metal adhesive layer formed on another portion of said ohmic contact epitaxy layer; and
    an electrode connecting channel, formed within said ohmic contact epitaxial layer, for electrically coupling said metal adhesive layer to said ohmic contact layer.

2. The light emitting diode of claim 1, wherein said substrate is a transparent substrate selected from a group consisting of sapphire, glass, GaP, GaAsP, ZnSe, ZnS, ZnSSe and SiC.

3. The light emitting diode of claim 1, wherein said thermal spreading layer is selected from a group consisting of diamond and diamond-like material.

4. The light emitting diode of claim 1, wherein said connecting layer is a transparent adhesive layer selected from a group consisting of Benzocyclobutene (BCB) and epoxy.

5. The light emitting diode of claim 1, wherein said ohmic contact epitaxial layer is formed of a p-type material.

6. The light emitting diode of claim 1, wherein said epitaxial structure comprises an upper cladding layer, a lower cladding layer and an active layer between said upper cladding layer and said lower cladding layer.

7. The light emitting diode of claim 1, wherein said substrate is a non-transparent substrate selected from a group consisting of Si, Al, Cu, Au, Mo and AlN.

8. The light emitting diode of claim 7, wherein said thermal spreading layer is selected from a group consisting of impurity-doped diamond and impurity-doped diamond-like material, wherein said doped impurity is selected from a group consisting of B, N and P.

9. The light emitting diode of claim 1, wherein said thermal spreading layer is selected from a group consisting of impurity-doped diamond and impurity-doped diamond-like material, wherein said doped impurity is selected from a group consisting of B, N and P.

10. The light emitting diode of claim 9, wherein said connecting layer comprises a first bonding layer comprising a gold (Au) layer and a second bonding layer comprising an indium (In) layer.

11. The light emitting diode of claim 9, further comprising:
    a protective layer formed on said substrate prior to forming said thermal spreading layer;
    a wetting layer formed on said thermal spreading layer; and
    a barrier layer formed between said wetting layer and said connecting layer;
    wherein said protective layer is selected from a group consisting of Ni, Au, Ag and Cr, said wetting layer is selected from a group consisting of Cr, Ti and Ni, and said barrier layer is selected from a group consisting of Mo, Pt, W, Indium Oxide, Tin Oxide, Indium Tin Oxide, Zinc Oxide and Magnesium Oxide.

12. The light emitting diode of claim 1, wherein said connecting layer comprises a first bonding layer comprising a gold (Au) layer and a second bonding layer comprising an indium (In) layer.

13. The light emitting diode of claim 1, further comprising:
    a protective layer formed on said substrate prior to forming said thermal spreading layer;
    a wetting layer formed on said thermal spreading layer; and
    a barrier layer formed between said wetting layer and said connecting layer;
    wherein said protective layer is selected from a group consisting of Ni, Au, Ag and Cr, said wetting layer is selected from a group consisting of Cr, Ti and Ni, and said barrier layer is selected from a group consisting of Mo, Pt, W, Indium Oxide, Tin Oxide, Indium Tin Oxide, Zinc Oxide and Magnesium Oxide.

* * * * *